United States Patent
Kausch

(10) Patent No.: US 8,395,461 B2
(45) Date of Patent: *Mar. 12, 2013

(54) MODE SWITCHING RC NETWORK

(75) Inventor: Marvin L. Kausch, Mountain View, CA (US)

(73) Assignee: Atmel Corporation, San Jose, CA (US)

( * ) Notice: Subject to any disclaimer, the term of this patent is extended or adjusted under 35 U.S.C. 154(b) by 47 days.

This patent is subject to a terminal disclaimer.

(21) Appl. No.: 13/285,352

(22) Filed: Oct. 31, 2011

(65) Prior Publication Data

US 2012/0043829 A1 Feb. 23, 2012

Related U.S. Application Data

(63) Continuation of application No. 12/166,849, filed on Jul. 2, 2008, now Pat. No. 8,054,144.

(51) Int. Cl.
*H03H 7/06* (2006.01)
(52) U.S. Cl. ............... 333/174; 333/172
(58) Field of Classification Search ............ 333/172, 333/174
See application file for complete search history.

(56) References Cited

U.S. PATENT DOCUMENTS

| | | | |
|---|---|---|---|
| 4,429,236 A | 1/1984 | Nitschke |
| 5,167,024 A | 11/1992 | Smith et al. |
| 5,466,976 A | 11/1995 | Ichihara |
| 5,903,746 A | 5/1999 | Swoboda et al. |
| 6,542,025 B1 | 4/2003 | Kutz et al. |
| 6,686,809 B2 | 2/2004 | Nystrom et al. |
| 6,754,839 B1 | 6/2004 | Wegner |
| 6,892,315 B1 | 5/2005 | Williams |
| 7,178,070 B2 | 2/2007 | Pihet et al. |
| 7,231,533 B2 | 6/2007 | Darmawaskita et al. |
| 2002/0140523 A1 | 10/2002 | Park et al. |
| 2010/0271248 A1 | 10/2010 | Yamaoka et al. |

*Primary Examiner* — Robert Pascal
*Assistant Examiner* — Kimberly Glenn
(74) *Attorney, Agent, or Firm* — Fish & Richardson P.C.

(57) ABSTRACT

Various embodiments include apparatus, systems, and methods having a conductive contact configured to couple to a resistor-capacitor (RC) network, a device unit coupled to the conductive contact, and a mode switching unit to change a characteristic of a signal at the conductive contact based at least in part on an RC time constant of the RC network. The mode switching unit may switch the device unit between a first operating mode and a second operating mode based on a signal level of the signal.

22 Claims, 10 Drawing Sheets

MODE SWITCHING RC NETWORK

CROSS REFERENCE TO RELATED APPLICATIONS

This application is a continuation of U.S. patent application Ser. No. 12/166,849, filed Jul. 2, 2008, which is now allowed. The disclosure of the prior application is considered part of (and is incorporated by reference in) the disclosure of this application.

BACKGROUND

Integrated circuit (IC) devices are widely used in electronic products. An IC device usually includes many different components enclosed in an IC package (or IC chip). Different components of an IC may perform different activities. Some IC devices may operate at a lower power mode for some activities and operate at a higher power mode for other activities. Some of these IC devices may use a crystal oscillator as a timer to switch between different power modes. In some cases, a crystal oscillator may be unsuitable for switching function in some IC devices.

DETAILED DESCRIPTION

One or more embodiments described herein include apparatus, systems, and methods having a device that may include a conductive contact configured to couple to an RC network, a device unit coupled to the conductive contact, and a mode switching unit to change a characteristic of a signal at the conductive contact based at least in part on an RC time constant of the RC network. The mode switching unit may switch the device unit between a first operating mode and a second operating mode based on a signal level of the signal. The first and second operating modes may include sleep and wakeup modes.

Example Apparatus Embodiment

Figure 1:
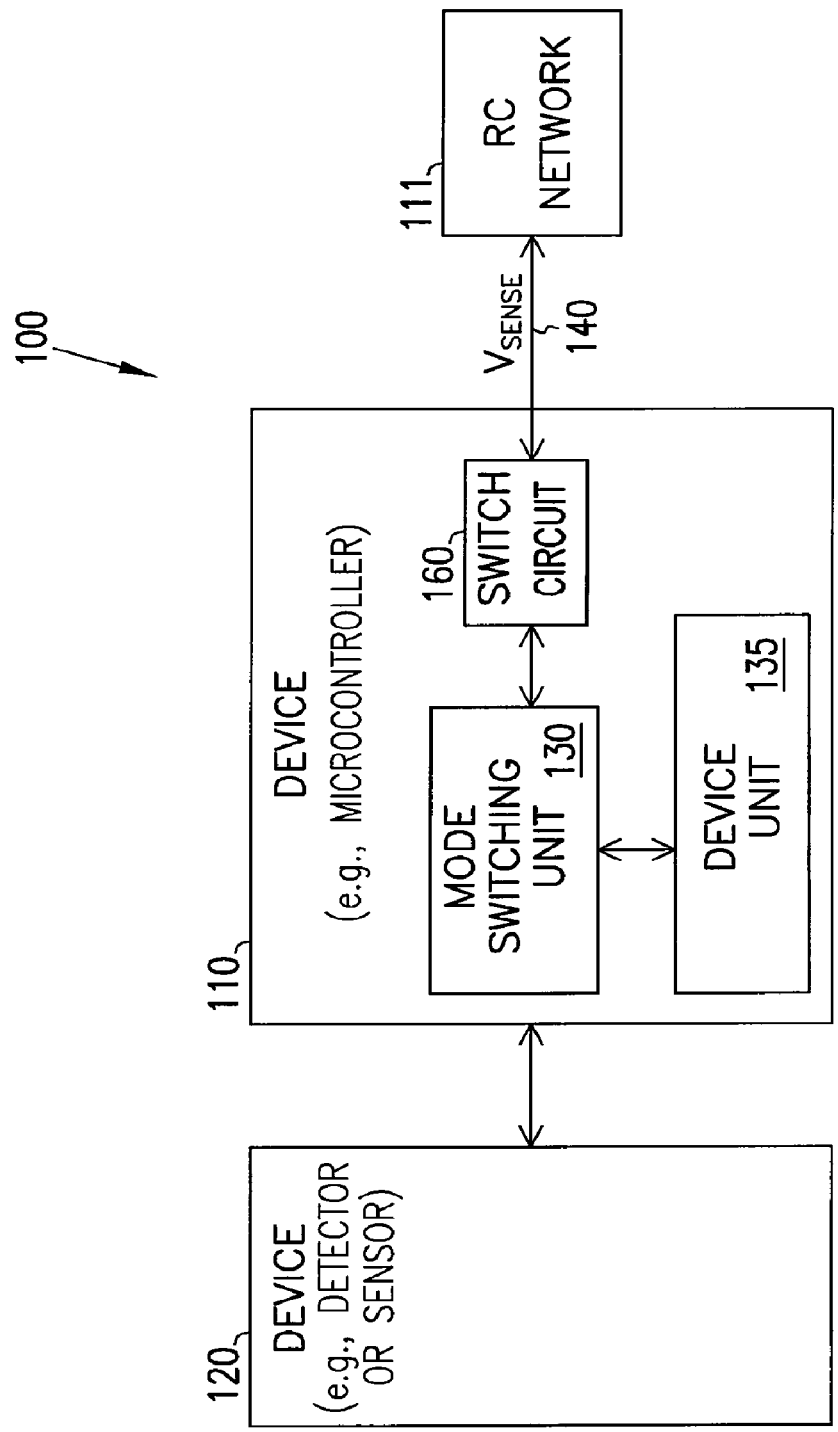
FIG. 1 shows an apparatus including devices and a resistor-capacitor (RC) network according to an embodiment of the invention.

FIG. 1 shows an apparatus 100 including devices 110 and 120 and an RC network 111 according to an embodiment of the invention. Apparatus 100 may include, or be included in, an electronic product such as a security alarm system, a motion sensor system, an automobile sensing system, an environment control system such as a digital thermostat, a health monitor system such as a pacemaker, or other electronic products such as a digital camera, a cellular phone, a television, and the like.

In FIG. 1, device 120 may include a functional unit to perform one or more specific functions. For example, device 120 may include a detector or a sensor to perform one or more functions such as detecting motion, sensing temperature or other elements, and detecting incoming signals sent to apparatus 100 from a device or a system that is external to apparatus 100. Device 120 may periodically or non-periodically provide information to device 110.

Device 110 may periodically or non-periodically communicate with device 120 to perform functions based on information that is obtained (e.g., detected or sensed) by device 120. FIG. 1 shows an example where device 110 may include a microcontroller. The microcontroller may include different components to perform different functions. For example, device 110 may include a microcontroller that may include a central controller unit to control overall functions of device 110, a serial input/output interface with an asynchronous receiver/transmitter such as an universal asynchronous receiver/transmitter (UART) or an universal synchronous/asynchronous receiver/transmitter (USART), an analog to digital converter, and a clock generator with a crystal oscillator. The microcontroller may also include a communication interface such as inter-integrated circuit ($I^2C$) and serial peripheral interface (SPI), an Ethernet interface, a liquid crystal display interface. The microcontroller may further include non-volatile memory such as electrically erasable programmable read-only memory (EEPROM) and flash memory. FIG. 1 shows device 110 including a device unit 135 to represent one or more components of device 110, such as one or more of the components of a microcontroller that are mentioned above or other additional components. For example, device unit 135 may include at least a central controller to perform functions such as executing one or more programmed instructions stored in device 110. Device 110 may alternatively include other integrated circuits such as general-purpose processors, application specific integrated circuits (ASICs), and other digital or analog controllers.

Device 110 may include different operating modes such as a wakeup mode and a sleep mode. In a wakeup mode, device 110 may perform functions such as executing one or more programmed instructions stored in device 110. The programmed instructions may include instructions to process information provided by device 120. When device 110 finishes executing programmed instructions or other functions, it may switch to a sleep mode to save power. Device 110 may execute no programmed instructions when it is in the sleep mode. Device 110 may switch at least a portion of device unit 135 or the entire device unit 135 between a sleep mode when device 110 is in the sleep mode and a wakeup mode when device 110 is in the wakeup mode.

In the sleep mode, almost all of the circuitry of device 110, such as a portion of device unit 135 or the entire device unit 135, may be in an inactive or disabled state. Circuitry of device 110 that is responsible for switching device 110 from a sleep mode to a wakeup mode may remain in an active state during the sleep mode. Since almost all of the circuitry of device 110 may be in an inactive or disabled state during a sleep mode, device 110 including device unit 135 may use less power in a sleep mode than in a wakeup mode. For example, device 110 may use approximately 0.6 mA to 16 mA (milliampere) in a wakeup mode and use approximately 10 nA to 20 nA (nanoampere) in a sleep mode.

Device 110 may stay in a sleep mode and then switch to a wakeup mode when one or more specific events occur. For example, device 110 may switch mode (e.g., switch between a sleep mode and a wakeup mode) when it receives an interrupt request from components inside device 110 or from components outside device 110, such as device 120 or other devices outside apparatus 100. The interrupt request may occur periodically or non-periodically and may come in a form of a programming command. In another example, device 110 may switch mode after a time interval has lapsed. The time interval may be predetermined in fixed time units (e.g., milliseconds). Thus, device 120 may switch mode based on interrupt information that may include either interrupt requests or a lapse in a time interval.

As shown in FIG. 1, device 110 may include a mode switching unit 130 that may respond to interrupt information to switch device 110 between different operating modes such as a sleep mode and a wakeup mode. As mentioned above, a portion of device unit 135 or the entire device unit 135 may also switch a sleep mode when device 110 is in a sleep mode and switch to a wakeup mode when device 110 is in a wakeup mode. Thus, when mode switching unit 130 switches device 110 between different operating modes, such as a sleep mode and a wakeup mode, switching unit 130 also switches a portion of device unit 135 or the entire device unit 135 between the corresponding different operating modes.

Mode switching unit 130 may include circuit components to perform interrupt functions of a microcontroller such as to switch device 110 from a sleep mode to a wakeup mode. The circuit components may include registers to store to instructions and data associated with the interrupt functions. Mode switching unit 130 may switch device 110 from a sleep mode to a wakeup mode when an interrupt request has occurred or when a specific time interval has lapsed. However, to illustrate the embodiments herein, this description discusses a switching of a device, such as device 110 of FIG. 1, from a sleep mode to a wakeup mode based on a lapse in a time interval. In FIG. 1, device 110 may derive a lapse in a time interval based on changes in signal level of a signal $V_{SENSE}$ on line 140.

Mode switching unit 130 may switch device 110 between a sleep mode and a wakeup mode based on changes in signal level of the signal $V_{SENSE}$. The changes in signal level of the $V_{SENSE}$ signal is dependent on the frequency of the $V_{SENSE}$ signal in which the frequency may be selected based on an RC time constant of RC network 111. The RC time constant is measured in time units such as seconds.

A switch circuit 160 may selectively provide various electrical coupling paths among mode switching unit 130, line 140, and RC network 111. Switch circuit 160 may include one or more switches. Each of the switches may include at least one transistor, which may turn on or off to act as a switch. FIG. 4 through FIG. 8 shows various examples of switch circuits that may implement switch circuit 160 of FIG. 1.

RC network 111 may include a combination of one or more resistors and one or more capacitors. The value of the RC time constant of RC network 111 is based on resistor and capacitor values of RC network 111. FIG. 4 through FIG. 8 shows various examples of RC networks with different combinations of resistors and capacitors that may be used for RC network 111 of FIG. 1. In FIG. 1, since mode switching unit 130 may switch device 110 between a sleep mode and a wakeup mode based on changes in signal level of the $V_{SENSE}$ signal and since the $V_{SENSE}$ signal has a frequency based on an RC time constant of RC network 111, mode switching unit 130 may switch device 110 between a sleep mode and a wakeup mode based on an RC time constant of RC network 111.

FIG. 1 shows device 110 in schematic illustration. Device 110, however, may include an IC package that encloses other components of device 110. Line 140 of FIG. 1 may represent a physical conductive contact of device 110. The conductive contact may include a node inside the IC package of device 110 or a solder ball, a pin, or other forms of conductive contacts attached to the outside of the IC package. FIG. 1 shows an example of apparatus 100 where RC network 111 is located outside device 110. However, a portion of RC network 111 or the entire RC network 111 may be located inside device 110. Thus, changes in signal level of the $V_{SENSE}$ signal at line 140 may include changes in signal level at conductive contact that couple to RC network 111 in which the conductive contact may include a node inside the IC package of device 110 or a solder ball, a pin, or other forms of conductive contacts attached to the outside of the IC package of device 110. RC network 111 may include a relatively fewer number of components such that it may use a relatively small amount of power to affect the signal level of the $V_{SENSE}$ signal, so that device 110 may switch between a sleep mode and a wakeup mode based on the signal level of the $V_{SENSE}$ signal. The power used in apparatus 100 may be provided by a power source, such as a battery. Since RC network 111 may use a relatively small amount of power, the power from a power source such as a battery may be saved.

First Example Timing Diagram

Figure 2:
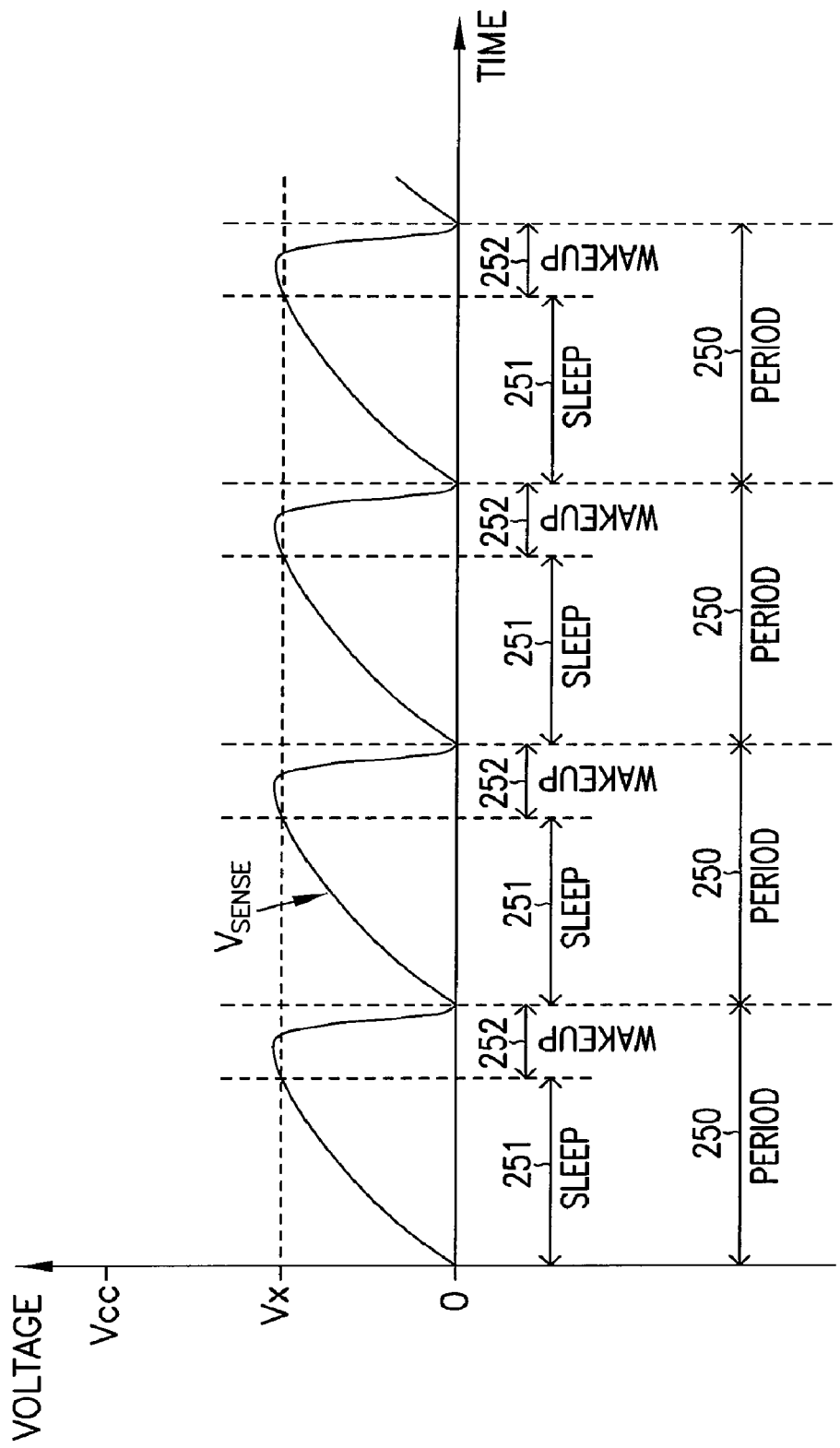
FIG. 2 shows an example timing diagram illustrating a characteristic of a signal of FIG. 1 during different operating modes of a device of FIG. 1.

FIG. 2 shows an example timing diagram illustrating a characteristic of the $V_{SENSE}$ signal of FIG. 1 and during different operating modes of device 110 of FIG. 1. As shown in FIG. 2, the $V_{SENSE}$ signal may include a frequency with a number of periods 250, each having time intervals 251 and 252. Device 110 of FIG. 1 may include a sleep mode during each time interval 251 and a wakeup mode during each time interval 252. As an example, time interval 251 may include a value from approximately ten milliseconds (ms) to approximately 20 ms, and time interval 252 may include a value from a few microseconds to approximately 100 microseconds. When device 110 is in a sleep mode, mode switching unit 130 may switch device 110 to a wakeup mode after time interval 251 has lapsed. In a wakeup mode, device 110 may perform functions such as executing programmed instructions during time interval 252. Then, mode switching unit 130 may switch device 110 from a wakeup mode back to a sleep mode after time interval 252. Mode switching unit 130 may repeat the switching process such that device 110 may periodically switch between a sleep mode and a wakeup mode based on changes in signal level of the $V_{SENSE}$ signal.

As shown in FIG. 2, mode switching unit 130 may switch device 110 between a sleep mode and a wakeup mode based on changes in signal level in each period 250 of the $V_{SENSE}$ signal. The signal level of the $V_{SENSE}$ signal may be set to zero (or substantially close to zero) volts or ground potential at the beginning of each time interval of 251 when device 110 is in a sleep mode. Then, mode switching unit 130 may cause the $V_{SENSE}$ signal to increase from zero volts to a voltage value Vx. Voltage value Vx may include a value equal to a fraction of a positive supply voltage Vcc of device 110. For example, Vx may have a value equal to one-half Vcc (Vx=0.5 Vcc). Voltage value Vx may alternatively include a value approximately equal to one Vcc (Vx=Vcc). In FIG. 2, when the $V_{SENSE}$ signal reaches a value such as voltage value Vx, mode switching unit 130 may switch device 110 from a sleep mode to a wakeup mode. In a wakeup mode, mode switch unit 130 may cause the $V_{SENSE}$ signal to decrease to zero (or substantially close to zero) volts before mode switch unit 130 switches device 110 back to the sleep mode. Mode switching unit 130 may cause the $V_{SENSE}$ signal to change between different signal levels and repeat the switching process based on changes signal level of the $V_{SENSE}$ signal in each period 250.

The value for time interval 251 (e.g., sleep mode) may be determined by selecting resistor and capacitor values of RC network 111. Thus, the value of time interval 251 may depend on a charging time of capacitor of RC network 111 that charges from ground potential to voltage value Vx. The charging time of the capacitor of RC network 111 is based on the RC time constant of RC network 111. Thus, by appropriately selecting resistor and capacitor values for RC network 111 and the voltage value Vx, the value for time interval 251 for device 110 may also be selected accordingly.

The value for time interval 252 (e.g., wakeup mode) may depend on the time it takes to perform functions such as executing programmed instructions in device 110. A person skilled in the art will readily determine the value for time interval 252 based on the time to perform functions such as executing specific instructions in a device (e.g., a microcontroller) such as device 110. The value of time interval 252 may also depend on a discharging time a capacitor of RC network 111 when the capacitor discharges from a voltage value, such as voltage value Vx, to zero volts during a wakeup mode. Thus, to switch device 110 from a wakeup mode to a sleep mode as quickly as possible to further save power, the value for time interval 252 may be set to be a lower value of a time it takes to perform functions such as executing programmed instructions and a discharging time of a capacitor of RC network 111.

Second Example Timing Diagram

Figure 3:
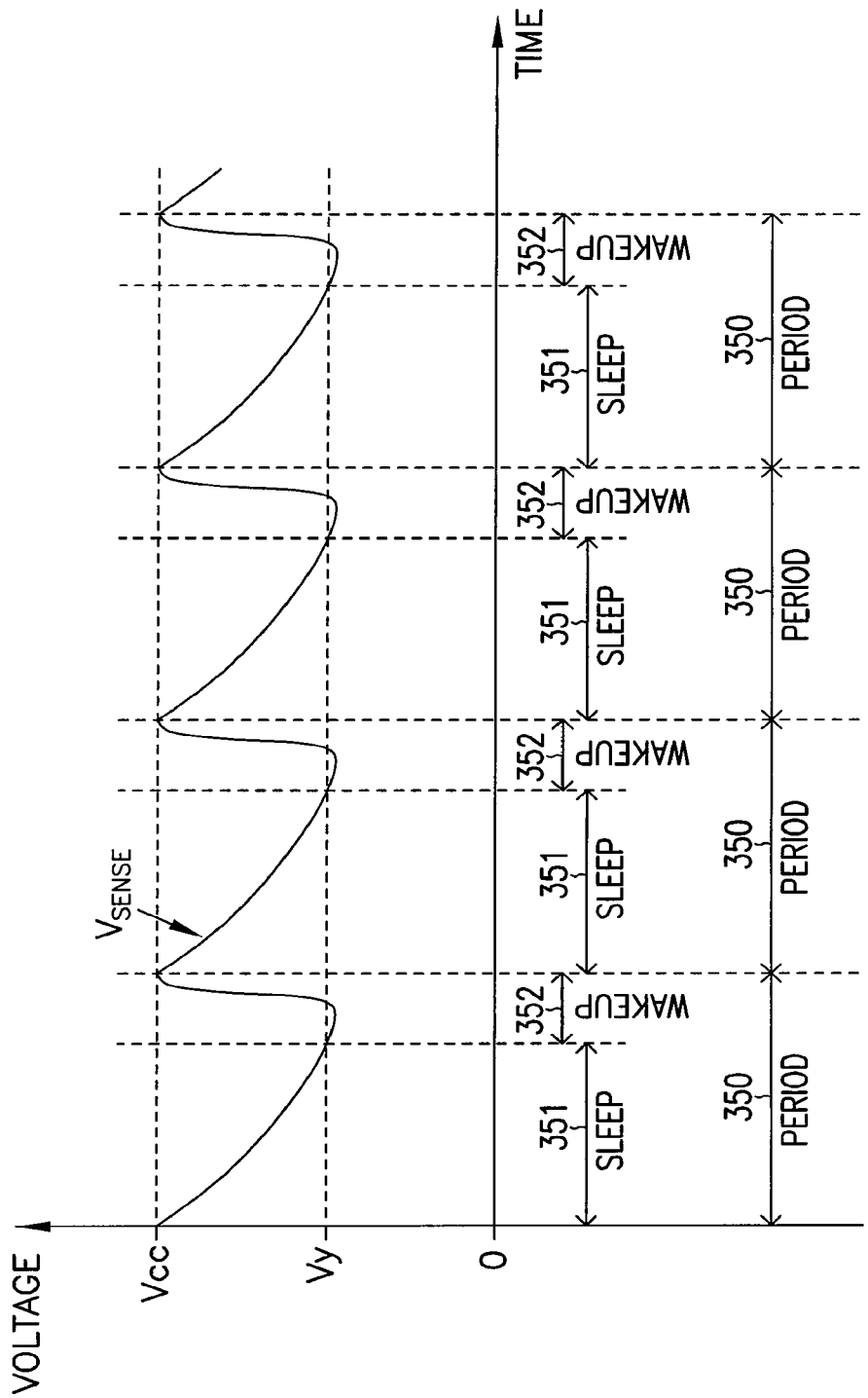
FIG. 3 shows another example timing diagram illustrating a characteristic of a signal of FIG. 1 during different operating modes of the device of FIG. 1.

FIG. 3 shows another example timing diagram illustrating characteristic of the $V_{SENSE}$ signal of FIG. 1 during different modes of device 110. The timing diagram of FIG. 3 is similar to the timing diagram of FIG. 2 except that the signal level of the $V_{SENSE}$ signal in each period 350 of FIG. 3 change in an opposite direction from that of each period 250 of FIG. 2. As shown in FIG. 3, during a sleep mode in time interval 351 in FIG. 3, the $V_{SENSE}$ signal may decrease from a voltage value Vcc to a voltage value Vy. Vy may include a value equal to a fraction of Vcc. For example, Vy may have a value equal to one-half Vcc (Vy=0.5 Vcc). Voltage value Vy may alternatively include a value approximately of zero volts. During a wakeup mode in time interval 352, the $V_{SENSE}$ signal may increase from some voltage or from voltage value Vy to Vcc. The waveform of the $V_{SENSE}$ signal in FIG. 3 may also depend on an RC time constant of RC network 111 of FIG. 1. For example, time interval 351 in FIG. 3 may be selected based on a time interval at which a capacitor of RC network 111 discharges from Vcc to Vy, and time interval 352 may be selected to be a lower value of a time it takes device 110 to perform functions such as executing programmed instructions and a charging time of a capacitor of RC network 111.

The timing diagrams of FIG. 2 and FIG. 3 show examples of a signal such as the $V_{SENSE}$ signal at a conductive contact of device 110 of FIG. 1. The conductive contact may include a node inside the IC package of device 110 or solder ball, a pin, or other forms of conductive contacts attached to the outside of the IC package of the device. An RC network, such as RC network 111 of FIG. 1, may cause the $V_{SENSE}$ signal to oscillate at a frequency based on an RC time constant of the RC network 111. Mode switching unit 130 of device 110 may monitor (e.g., by sensing) changes in signal level of the $V_{SENSE}$ signal to switch between a sleep mode and a wakeup mode.

Example Apparatus Embodiment With First Device-RC Network Arrangement

Figure 4:
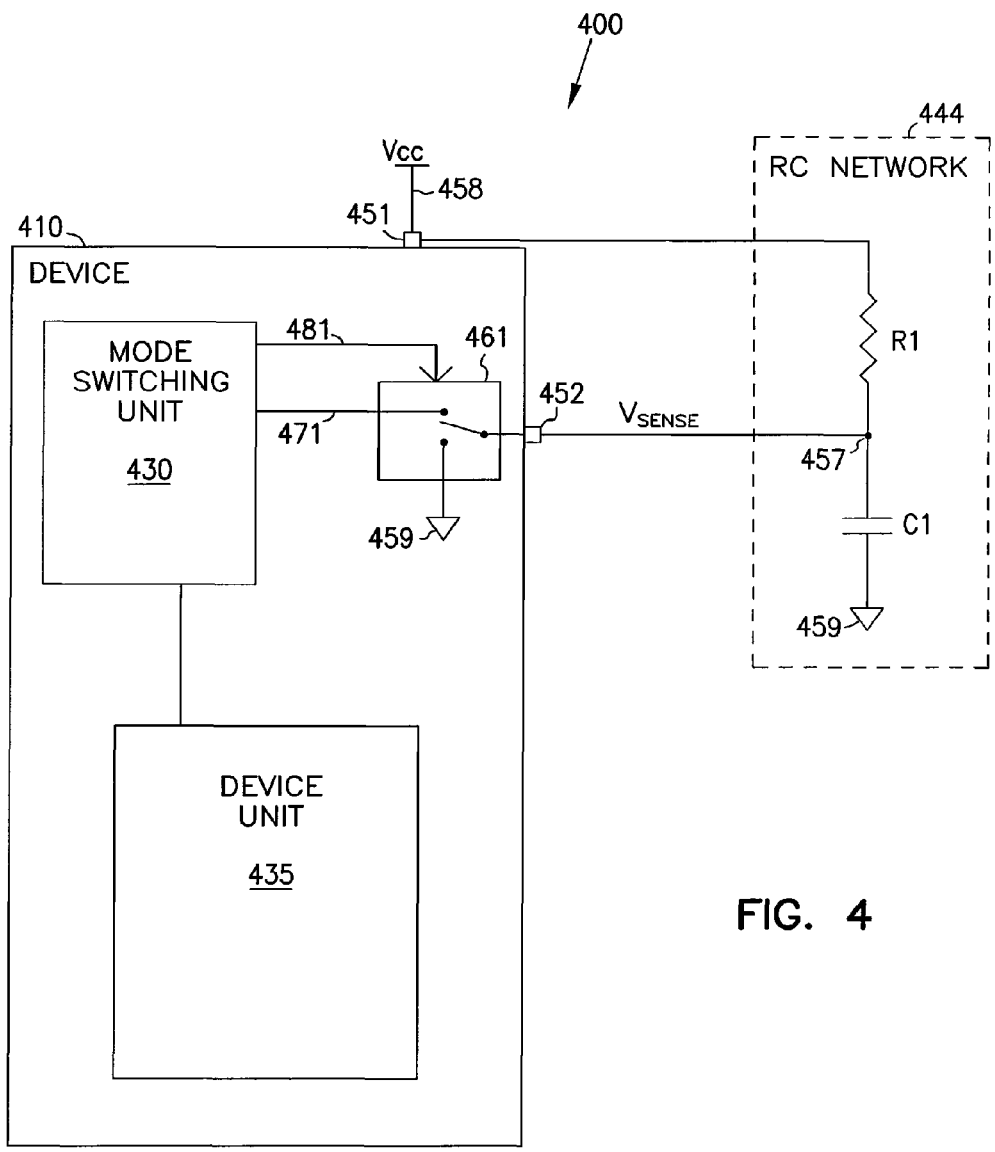
FIG. 4 shows an apparatus having a device and an RC network with a single capacitor and a single resistor, according to an embodiment of the invention.

FIG. 4 shows an apparatus 400 having a device 410 and an RC network 444 with a single capacitor C1 and a single resistor R1, according to an embodiment of the invention. Device 410, switch 461, and RC network 444 may implement device 110, switch circuit 160, and RC network 111, respectively, of FIG. 1.

FIG. 4 shows both resistor R1 and capacitor C1 being located outside device 410 as an example. However, resistor R1, capacitor C1, or both may be located inside device 410.

Device 410 may include components and functions similar to or identical to those of device 110 of FIG. 1. For example, device 410 may include a microcontroller or other controller with a device unit such as device unit 435 to perform functions, such as executing programmed instructions, during a wakeup mode and then switching from the wakeup mode to a sleep mode when it finishes performing the functions to save power.

Device 410 may include a mode switching unit 430 to switch device 410 between a sleep mode and a wakeup mode based on the $V_{SENSE}$ signal. The $V_{SENSE}$ signal may include a waveform similar to or identical to the waveform of the $V_{SENSE}$ signal in FIG. 2. For example, the $V_{SENSE}$ signal of FIG. 4 may oscillate at a frequency. Device 410 may include a sleep mode during one time interval of the period of the $V_{SENSE}$ signal and a wakeup mode during another time interval of the same period. The time that device 410 stays in a sleep mode may be proportional to the RC time constant of resistor R1 and capacitor C1 of RC network 444. For example, a greater value of the RC time constant of resistor R1 and capacitor C1 may result in a greater value for the time interval of the sleep mode in each period of the $V_{SENSE}$ signal. Thus, the time interval of the sleep mode in device 410 may be selected by appropriately selecting the values for resistor R1 and capacitor C1.

The RC time constant $\tau_1$ of network 444 is calculated based on equation (1) below.

$$\tau_1 = RC \qquad (1)$$

In equation (1) above, $\tau_1$ represents the time constant in second unit, R represents the value of resistor R1 in resistance in ohm unit, and C represents the value of capacitor C1 in farad unit. Resistor R1 may have a value ranging from approximately one mega ohm to approximately ten mega ohms. Capacitor C1 may have a value in a range of a few nanofarads to approximately ten nanofarads.

A person skilled in the art will recognize that capacitor C1 may charge from zero volt to approximately 63% of Vcc (or 0.63 Vcc) in one RC time constant (i.e., $1\tau_1$) of RC network 444 and that capacitor C1 may charge from zero volt to approximately Vcc in about five RC time constants (i.e., $5\tau_1$) of RC network 444. Since the $V_{SENSE}$ signal is derived from a node 457 that is coupled to capacitor C1, the signal level of the $V_{SENSE}$ signal may change from approximately zero volts to 0.63 Vcc in one $\tau_1$ or from zero volts to Vcc in five $\tau_1$. Thus, the values of resistor R1 and capacitor C1 may be selected such that mode switching unit 430 may switch device 410 from a sleep mode to a wakeup mode when the signal level of $V_{SENSE}$ reaches a specific value, such as Vx in FIG. 2, that is a function of Vcc. For example, the specific value may be equal to a fraction of Vcc or equal to approximately one Vcc. The fraction of Vcc may include one-half Vcc (0.5 Vcc). Since the signal of $V_{SENSE}$ may increase from zero volts to 0.63 Vcc in one RC time constant (i.e., one $\tau_1$) of RC network 444, the $V_{SENSE}$ signal may reach 0.5 Vcc in less than one $\tau_1$. The time interval for a sleep mode of device 410 may be set to be equal to a fraction of the RC time constant of resistor R1 and capacitor C1 or equal to multiple of the RC time constant of resistor R1 and capacitor C1.

As shown in FIG. 4, device 410 may include a conductive contact 451 to provide a voltage Vcc from a supply node 458 to capacitor C1 and resistor R1 that are coupled in series between conductive contact 451 and a supply node 459. FIG. 4 shows a ground symbol as an example for supply node 459 to indicate that supply node 459 may include ground potential or zero volts. Supply node 459, however, may include a node having a non-ground potential or non-zero volts. Supply nodes 458 and 459 may include nodes from a power source, such as a battery, of apparatus 400 to supply power to device 410. Device 410 may include another conductive contact 452 that is coupled to a node 457 between resistor R1 and capacitor C1 to receive the $V_{SENSE}$ signal. Mode switching unit 430 may monitor (e.g., by sensing) changes in signal level of the $V_{SENSE}$ signal to switch device 410 between a sleep mode and a wakeup mode.

In operation, for example, device 410 is in a sleep mode and conductive contact 452 is coupled to line 471 (e.g., sense line) via switch 461. In this example, mode switching unit 430 may use line 471 to monitor changes in signal level of the $V_{SENSE}$ signal. Before device 410 is in the sleep mode, mode switching unit 430 may cause the signal level of the $V_{SENSE}$ signal to be at zero (or substantially close to zero) volts or ground potential by coupling conductive contact 452 to supply node 459. Then at the beginning of the sleep mode, mode switching unit 430 may decouple conductive contact 452 from supply node 459 and couple conductive contact 452 to line 471. Thus, the signal level of the $V_{SENSE}$ signal at node 452 may be approximately zero volts at the beginning of the sleep mode in this example when node 452 is coupled to line 471. Mode switching unit 430 may switch device 410 from the sleep mode to a wake up mode when the signal level of the $V_{SENSE}$ signal reaches a voltage value such as Vx in FIG. 3 where Vx is equal to a fraction of Vcc. The time interval for the $V_{SENSE}$ signal to reach a voltage value such as Vx is proportional to the charging time of capacitor C1. After switching to a wakeup mode, device 410 may perform functions such as executing programmed instructions. Before the end or at the end of the functions, mode switching unit 461 may use line 481 to control switch 461 to decouple conductive contact 452 from line 471 and couple conductive contact 452 to supply node 459 through switch 461. Capacitor C1 may discharge to zero volts or ground potential through switch 461. When the voltage at conductive contact 452 reaches zero (or approximately zero) volts, mode switching unit 430 may decouple (e.g., release) conductive contact 452 from supply node 459, couple conductive contact 452 to a line 417 through switch 461, and switch device 410 from a wakeup mode to a sleep mode. Device 410 may stay in a sleep mode for a time interval and then switch to a wakeup mode after the time interval has lapsed. The time interval during which device 410 stays in a sleep mode may be similar to or identical to time interval 251 of FIG. 2. The process may repeat such that device 410 may include a sleep mode and a wakeup mode based on changes in signal level of the $V_{SENSE}$ signal.

As shown in FIG. 4, RC network 444 may include only one resistor (e.g., R1) and only one capacitor (e.g., C1). Therefore, RC network 444 may use a relatively small amount of power to affect the signal level of the $V_{SENSE}$ signal. As mentioned above, apparatus 400 may include a power source, such as a battery, to supply power to device 410. Since RC network 444 may use a relatively small amount of power, the power from a power source such as a battery may be saved.

Switch 461 may include one or more transistors or other circuit components to couple and decouple conductive contact 452 from different nodes during a sleep and wakeup modes as described above. Further, FIG. 4 shows an example embodiment of device 410 with two conductive contacts 451 and 452. Device 410, however, may include many conductive contacts, which may include solder balls, pins, or other forms of conductive contacts to allow transferring of signals to and from device 410. For example, conductive contact 451 may allow device 410 to receive power signals and conductive contact 451 may allow device 410 to transfer input/output (I/O) information to and from device 410 such as data, address, control, or other information.

Example Apparatus Embodiment With Second Device-RC Network Arrangement

Figure 5:
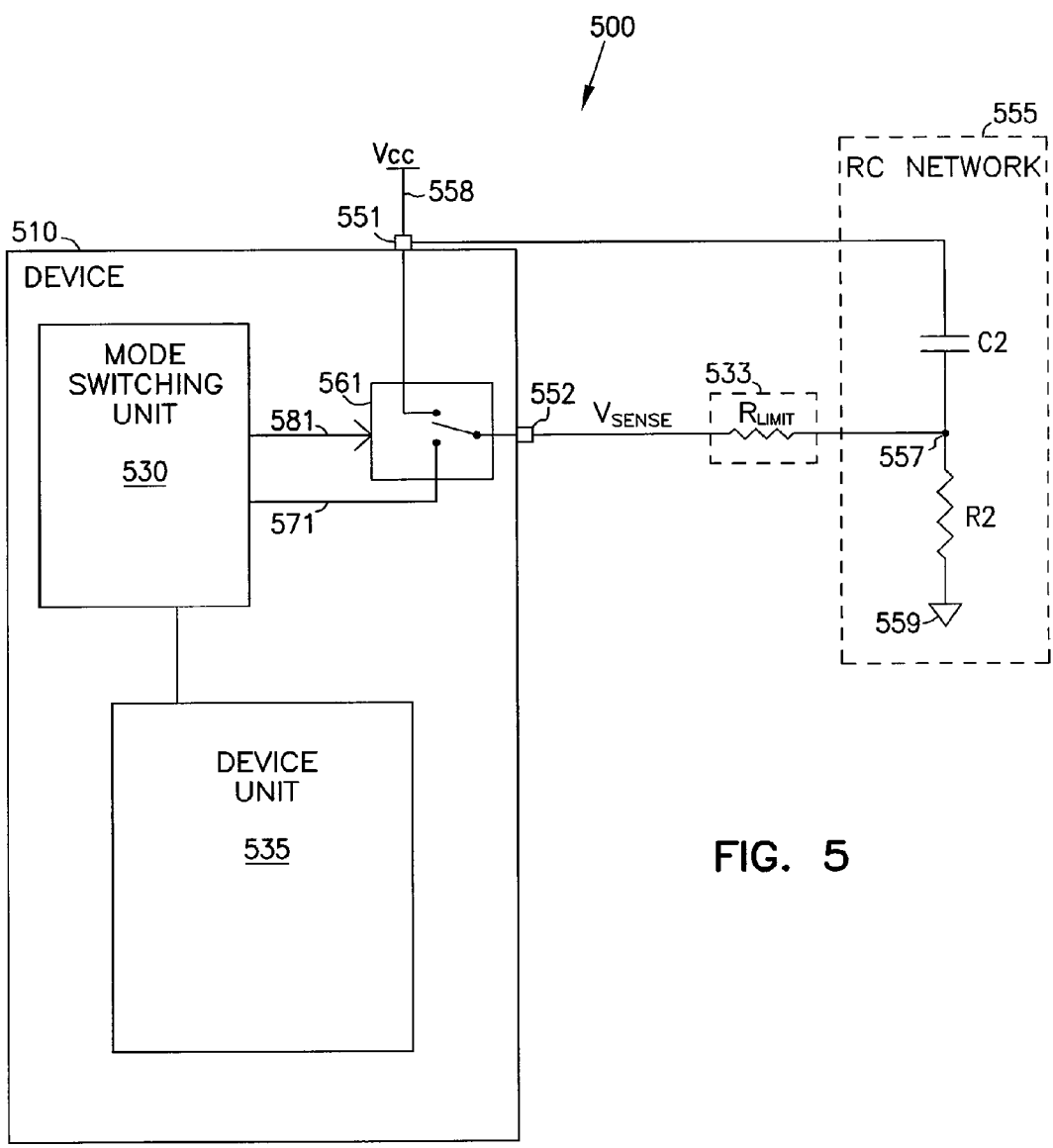
FIG. 5 shows another apparatus having a device and an RC network with a single capacitor and a single resistor, according to an embodiment of the invention.

FIG. 5 shows another apparatus 500 having a device 510 and an RC network 555 with a single capacitor C2 and a single resistor R2, according to an embodiment of the invention. Device 510, switch 561, and RC network 555 may implement device 110, switch circuit 160, and RC network 111, respectively, of FIG. 1. RC network 555 of FIG. 5 and RC network 444 of FIG. 4 are different from each other at least in the relative locations of capacitors C1 and C2 and the relative locations of resistors R1 and R2. Further in FIG. 5, apparatus 500 may include an additional component 533.

FIG. 5 shows resistor R2, capacitor C2, and component 533 being located outside device 510 as an example. However, one, or two, or all of resistor R2, capacitor C2, and component 533 may be located inside device 510.

Device 510 may include components and functions similar to or identical to those of device 110 of FIG. 1. For example, device 510 may include a microcontroller or other controller with a device unit such as device unit 535 to perform functions, such as executing programmed instructions, during a wakeup mode and then switching from the wakeup mode to a sleep mode when it finishes performing the functions to save power.

Device 510 may include a mode switching unit 530 to switch device 510 between a sleep mode and a wakeup mode based on the $V_{SENSE}$ signal. The $V_{SENSE}$ signal may include a waveform similar to or identical to the waveform of the $V_{SENSE}$ signal in FIG. 3. Device 510 may include a sleep mode during one time interval of a period of the $V_{SENSE}$ signal and a wakeup mode during another time interval of the same period. The time that device 510 stays in a sleep mode may be proportional to the RC time constant of resistor R2 and capacitor C2 of RC network 555. Thus, the time interval of the sleep mode in device 510 may be selected by appropriately selecting the values for resistor R2 and capacitor C2.

The RC time constant $\tau_2$ of RC network 555 is calculated based on equation (12) below.

$$\tau_2 = RC \quad (2)$$

In equation (2) above, $\tau_2$ represents the time constant in second unit, R represents the value of resistor R2 in resistance in ohm unit, and C represents the value of capacitor C2 in farad unit. Resistor R2 may have a value ranging from one mega ohms to ten mega ohms. Capacitor C2 may have a value in a range of a few nanofarads to approximately ten nanofarads.

A person skilled in the art will recognize that capacitor C2 may discharge from Vcc to approximately 37% of Vcc (or 0.37 Vcc) in one RC time constant (i.e., $1\tau_2$) of RC network 555 and that capacitor C2 may discharge from Vcc to approximately zero in about five RC time constants (i.e., $5\tau_2$) of RC network 555. Since the $V_{SENSE}$ signal is derived from a node 557 that is coupled to capacitor C2, the signal level of the $V_{SENSE}$ signal may change from Vcc to approximately 0.37 Vcc in one $\tau_2$ or from Vcc to approximately zero volts in five $\tau_2$. Thus, the values of resistor R2 and capacitor C2 may be selected such that mode switching unit 530 may switch device 510 from a sleep mode to a wakeup mode when the signal level of $V_{SENSE}$ reaches a specific value, such as Vy in FIG. 3, that is a function of Vcc. The specific value may be equal to a fraction of Vcc or equal to approximately zero. The fraction of Vcc may include one-half or 0.5 Vcc. Since the signal of $V_{SENSE}$ may decrease from Vcc to 0.37 Vcc in one RC time constant (i.e., one $\tau_2$) of RC network 555, the $V_{SENSE}$ signal may reach 0.5 Vcc in less than one $\tau_2$. The time interval for a sleep mode of device 510 may be set to be equal to a fraction of the RC time constant of resistor R2 and capacitor C2 or equal to multiple of the RC time constant of resistor R2 and capacitor C2. The fraction of Vcc may include one-half or 0.5 Vcc. Since the signal of $V_{SENSE}$ may increase from zero volts to 0.63 Vcc in one RC time constant (i.e., one $\tau_1$) of RC network 444, the $V_{SENSE}$ signal may reach 0.5 Vcc in less than one $\tau_1$.

As shown in FIG. 5, device 510 may include a conductive contact 551 to provide a voltage Vcc from a supply node 558 to capacitor C2 and resistor R2 that are coupled in series between conductive contact 551 and a supply node 559. FIG. 5 shows a ground symbol as an example for supply node 559 to indicate that supply node 559 may include ground potential or zero volts. Supply node 559, however, may include a node having a non-ground potential or non-zero volts. Supply nodes 558 and 559 may include nodes from a power source, such as a battery, of apparatus 400 to supply power to device 510. Device 510 may include another conductive contact 552 that is coupled to a node 557 between resistor R2 and capacitor C2 to receive the $V_{SENSE}$ signal. Mode switching unit 530 may monitor (e.g., by sensing) changes in signal level of the $V_{SENSE}$ signal to switch device 510 between a sleep mode and a wakeup mode.

In operation, for example, device 510 is in a sleep mode and conductive contact 552 is coupled to line 571 (e.g., sense line) via switch 561. In this example, mode switching unit 530 may use line 571 to monitor changes in signal level of the $V_{SENSE}$ signal. Before device 510 is in the sleep mode, mode switching unit 530 may cause the signal level of the $V_{SENSE}$ signal to be at Vcc (or substantially close to Vcc) by coupling conductive contact 552 to supply node 558. Then at the beginning of the sleep mode, mode switching unit 530 may decouple conductive contact 552 from supply node 558 and couple conductive contact 552 to line 571. Thus, the signal level of the $V_{SENSE}$ signal at node 552 may be approximately Vcc at the beginning of the sleep mode in this example when node 552 is coupled to line 571. Mode switching unit 530 may switch device 510 from a sleep mode to a wake up mode when the signal level of the $V_{SENSE}$ signal reaches a voltage value such as Vy in FIG. 3 where Vy is equal to a fraction of Vcc. The time interval for the $V_{SENSE}$ signal to reach a voltage value Vy is proportional to the discharging time of capacitor C2. After switching to a wakeup mode, device 510 may perform functions such as executing programmed instructions. Before the end or at the end of the functions, mode switching unit 530 may charge capacitor to Vcc by using line 581 to control switch 561 to decouple conductive contact 552 from line 571 and couple conductive contact 552 to supply node 558 through switch 561 and conductive contact 551. Capacitor C2 may charge to Vcc through switch 561. When the voltage at conductive contact 552 reaches Vcc, mode switching unit 530 may decouple conductive contact 552 from supply node 558, couple conductive contact 552 to line 571 through switch 561, and switch device 510 from a wakeup mode to a sleep mode. Device 510 may stay in a sleep mode for a time interval and then switch to a wakeup mode after the time interval has lapsed. The time interval during which device 510 stays in a sleep mode may be similar to or identical to time interval 251 of FIG. 3. The process may repeat such that device 510 may include a sleep mode and a wakeup mode based on changes in signal level of the $V_{SENSE}$ signal.

As shown in FIG. 5, RC network 555 may include only one resistor (e.g., R2) and only one capacitor (e.g., C2). Therefore, RC network 555 may use a relatively small amount of power to affect the signal level of the $V_{SENSE}$ signal. As mentioned above, apparatus 500 may include a power source, such as a battery, to supply power to device 510. Since RC network 555 may use a relatively small amount of power, the power from a power source such as a battery may be saved.

As shown in FIG. 5, circuit component 533 may be coupled between node 657 and conductive contact 552. In some cases, a relatively high amount of discharge current (e.g., a current spike) may occur at conductive contact 552 when capacitor C3 discharges during a sleep mode of device 510. Without the inclusion of circuit component 533, the relatively high amount of discharge current may disrupt operations of device 510 or affect its the performance. Circuit component 533 may function as a current limiter reduce or eliminate relatively high amount of discharge current that pass through node 552 to avoid operation disturbance to device 510 or improve its performance. FIG. 5 shows component 533 including a resistor $R_{LIMIT}$ coupled between node 557 and conductive contact 552 as an example. Component 533 may alternatively include other component such as a transistor instead of a resistor.

Switch 561 may include one or more transistors or other circuit components to couple and decouple conductive contact 552 from different nodes during a sleep and wakeup modes as described above. Further, FIG. 5 shows an example embodiment of device 510 with two conductive contacts 551 and 552. Device 510, however, may include many conductive contacts, which may include solder balls, pins, or other forms of conductive contacts to allow transferring of signals to and from device 510. For example, conductive contact 551 may allow device 510 to receive power signal and conductive contact 551 may allow device to transfer input/output (I/O) information to and from device 510 such as data, address, control, or other information.

Example Apparatus Embodiment With Third Device-RC Network Arrangement

Figure 6:
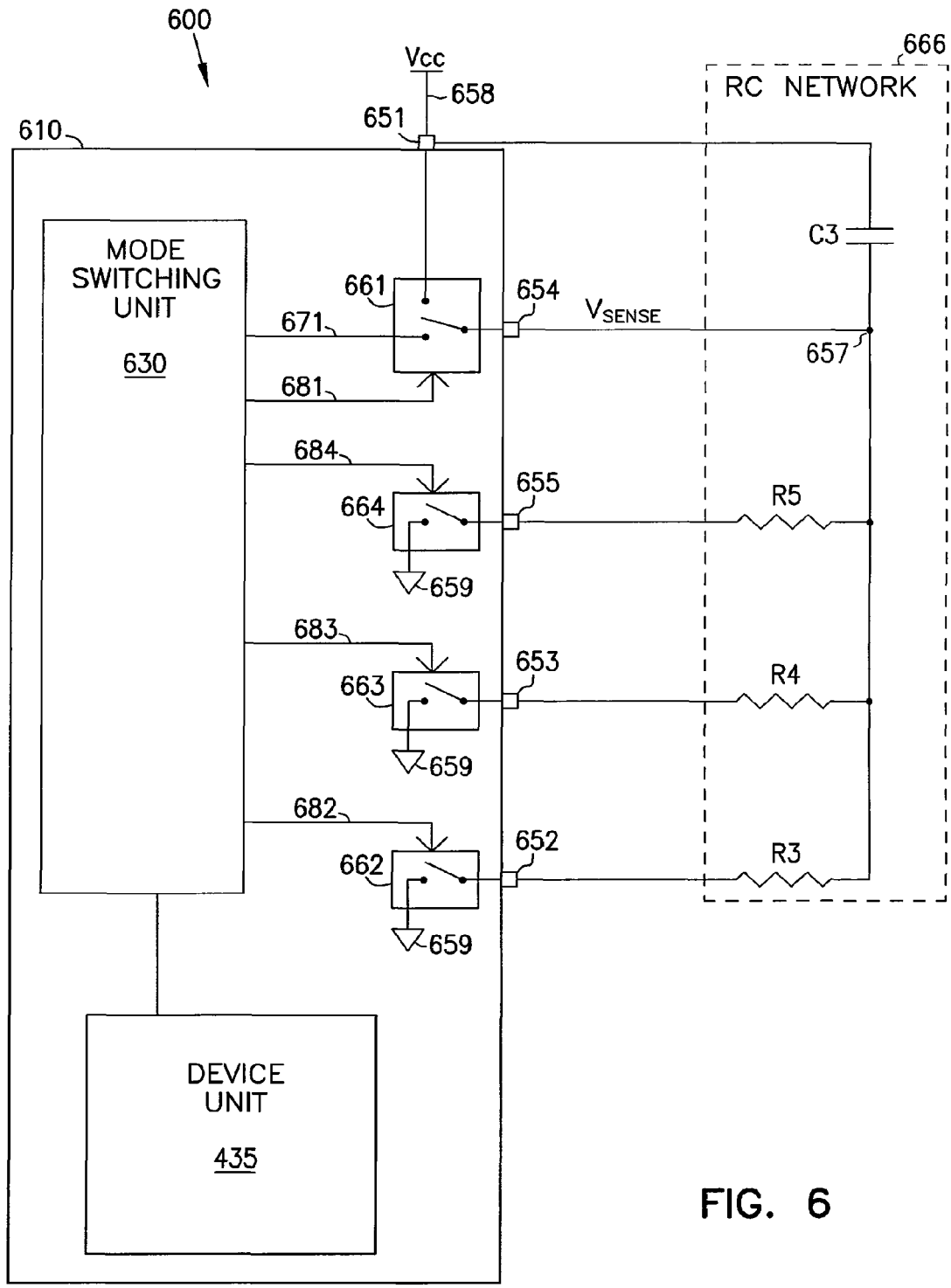
FIG. 6 shows another apparatus having a device and an RC network with a single capacitor and multiple resistors, according to an embodiment of the invention.

FIG. 6 shows another apparatus 600 having a device 610 and an RC network 666 with a single capacitor C3 and multiple resistors R3, R4, and R5, according to an embodiment of the invention. Device 610 and RC network 666 may implement device 110 and RC network 111, respectively, of FIG. 1. Switches 661, 662, 663, and 664 of FIG. 6 may implement switch circuit 160 of FIG. 1. RC network 666 of FIG. 6 and RC network 555 of FIG. 5 are different from each other at least in the number of resistors. For example, RC network 666 of FIG. 6 includes multiple resistors R3, R4, and R5, whereas RC network 555 of FIG. 5 includes only a single resistor R2.

FIG. 6 shows capacitor C3 and resistors R3, R4, and R5 being located outside device 610 as an example. However, one or more of capacitor C3 and resistors R3, R4, and R5 may be located inside device 610.

Device 610 may include components and functions similar to or identical to those of device 110 of FIG. 1. For example, device 610 may include a microcontroller or other controller with a device unit such as device unit 635 to perform functions, such as executing programmed instructions, during a wakeup mode and then switching from the wakeup mode to a sleep mode when it finishes performing the functions to save power.

Device 610 may include a mode switching unit 630 to switch device 610 between a sleep mode and a wakeup mode based on the $V_{SENSE}$ signal. The $V_{SENSE}$ signal may include a waveform similar to or identical to the waveform of the $V_{SENSE}$ signal in FIG. 3. Device 610 may include a sleep mode during one time interval of a period of the $V_{SENSE}$ signal and a wakeup mode during another time interval of the same period. The time that device 610 stays in a sleep mode may be proportional to the RC time constant of capacitor C3 and one or more of resistors R3, R4, and R5 of RC network 666.

The RC time constant $\tau_3$ of RC network 666 is calculated based on equation (3) below.

$$\tau_3 = RC \quad (3)$$

In equation (3) above, $\tau_3$ represents the time constant, C represents the value of capacitor C3, and R represents the value of resistor R3, R4, or R5 or a combination of two or more of R3, R4, and R5, depending which one or which combination of R3, R4, and R5 that device 610 uses to select a time interval for its sleep mode. For example, if device 610 uses all of R3, R4, and R5, then R in equation (3) represents a value of a parallel combination of R3, R4, and R5. In another example, if device 610 uses only resistor R3, then R in equation (3) represents a value of only resistor R3. Resistors R3, R4, and R5 may have the same or different values. The arrangement of multiple resistors in RC network 666 allows time constant $\tau_3$ of RC network 666 to be variable so that different values for a time interval for a sleep mode of device 610 may be selected. For example, a greater time interval for a sleep mode of device 610 may be selected by using a greater number of resistors R3, R4, and R5, and vice versa.

As shown in FIG. 6, device 610 may include a conductive contact 651 to provide a voltage Vcc from a supply node 658 to a terminal of capacitor C3 and one or more of resistors R3, R4, and R5 that are coupled to a supply node 659. FIG. 6 shows a ground symbol as an example for supply node 659 to indicate that supply node 659 may include ground potential or zero volts. Supply node 659, however, may include a node having a non-ground potential or non-zero volts. Supply nodes 658 and 659 may include nodes from a power source, such as a battery, of apparatus 400 to supply power to device 610. Device 610 may include conductive contacts 652, 653, 654, and 655 coupled to RC network 666 as shown in FIG. 6. Device 610 may use conductive contact 652 to receive the $V_{SENSE}$ signal from a node 657 between capacitor C3 and one of resistors R3, R4, and R5 or between capacitor C3 and a combination of resistors R3, R4, and R5. Mode switching unit 630 may monitor changes in signal level of the $V_{SENSE}$ signal to switch device 610 between a sleep mode and a wakeup mode.

In operation, for example, device 610 is in a sleep mode and conductive contact 654 is coupled to line 671 (e.g., sense line) via a switch 661. In this example, mode switching unit 630 may use line 671 to monitor changes in signal level of the $V_{SENSE}$ signal, which may have a value of approximately Vcc at the beginning of a sleep mode. Mode switching unit 630 may switch device 610 from a sleep mode to a wake up mode when the signal level of the $V_{SENSE}$ signal reaches a voltage value such as Vy in FIG. 3 where Vy is equal to a fraction of Vcc or equal approximately to Vcc. The time interval for the $V_{SENSE}$ signal to reach a voltage value Vy depends on the discharging time of capacitor C3. The discharging time depends on the number of resistors R3, R4, and R5 that are used. Mode switching unit 630 may use one or more of resistors R3, R4, and R5 and disable the unused resistor or resistors. Mode switching unit 630 may disable resistors R3, R4, or R5 by decoupling the unused resistor from supply node 659 to disconnect a conductive path between supply node 658 and 659 through the unused (disabled) resistor. For example, if device 610 uses only R3, then mode switching unit 630 may use lines 683 and 684 to control switches 663 and 664, respectively, to decouple resistors R4 and R5 from supply node 659. Mode switching unit 630 may use line 682 to control switch 662 to couple resistor R3 to supply node 659. Thus, in this example, mode switching unit 630 may switch device 610 from a sleep mode to a wake up mode when the signal level of the $V_{SENSE}$ signal reaches a voltage value such as Vy within a time interval based on the time constant calculated from the value of capacitor C3 and only resistor R3.

After switching to a wakeup mode, device 610 may perform functions such as executing programmed instructions. Before the end or at the end of the functions, mode switching unit 630 may charge capacitor C3 to Vcc by using line 681 to control switch 661 to decouple conductive contact 654 from line 671 and couple conductive contact 654 to supply node 658 through switch 661 and conductive contact 651. Capacitor C3 may charge to Vcc through switch 661. When the voltage at conductive contact 654 reaches Vcc, mode switching unit 630 may decouple conductive contact 654 from supply node 658, couple conductive contact 654 to a line 671 through switch 661, and switch device 610 from a wakeup mode to a sleep mode. Device 610 may stay in a sleep mode for a time interval and then switch to a wakeup mode after the time interval has lapsed. The time interval during which device 610 stays in a sleep mode may be similar to or identical to time interval 251 of FIG. 3. The process may repeat such that device 610 may include a sleep mode and a wakeup mode based on changes in signal level of the $V_{SENSE}$ signal.

FIG. 6 shows apparatus 600 without a circuit component, such as circuit component 533 of FIG. 5, coupled between conductive contact 654 and node 657. Alternatively, apparatus 600 may include a circuit component, such as circuit component 533 of FIG. 5, coupled between conductive contact 654 and node 657 to reduce or eliminate a relatively high amount of discharge current that may occur when capacitor C3 discharges to avoid operation disturbance to device 610 or improve its performance.

Example Apparatus Embodiment With Fourth Device-RC Network Arrangement

Figure 7:
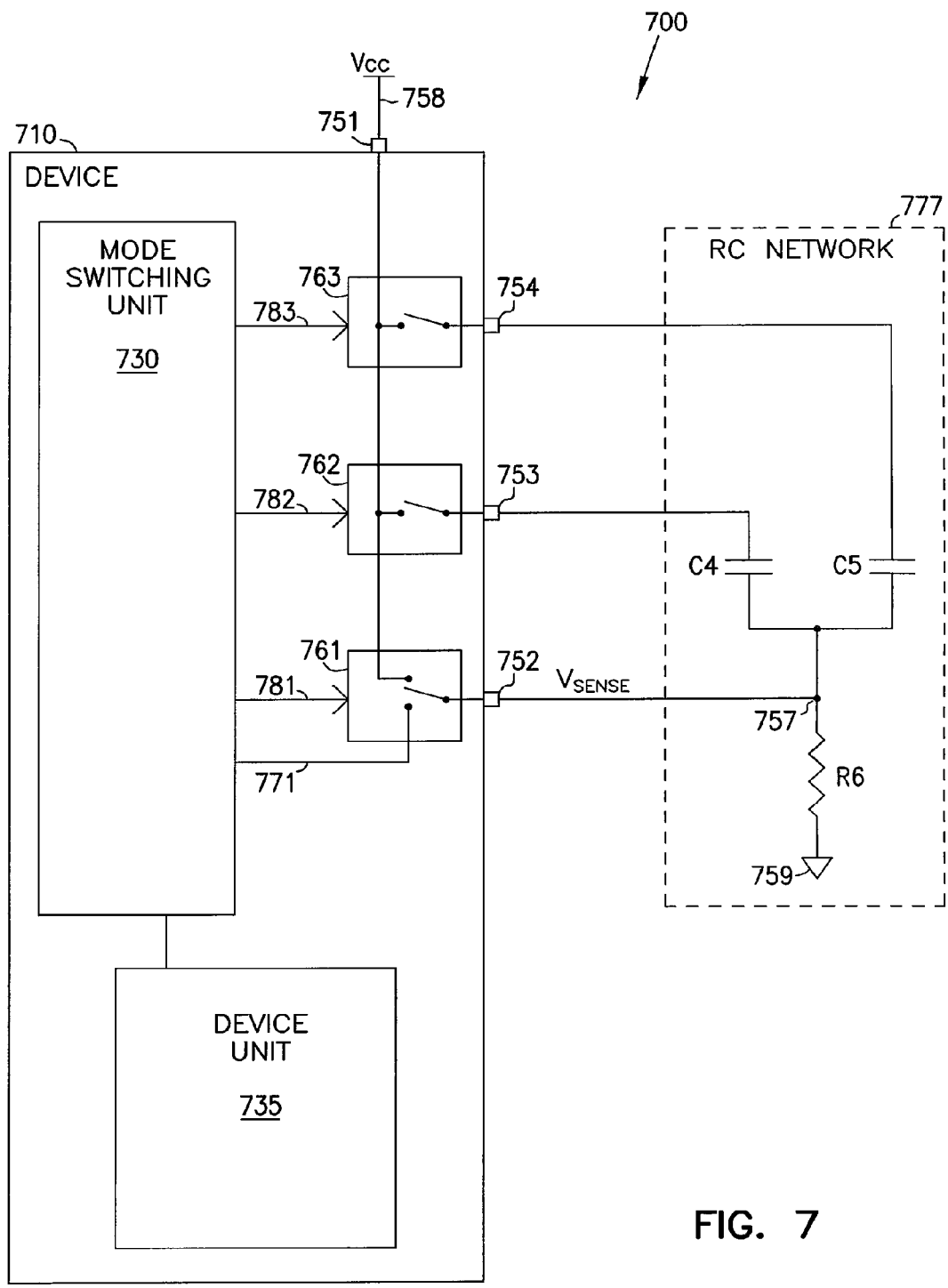
FIG. 7 shows an apparatus having a device and an RC network with a single resistor and multiple capacitors, according to an embodiment of the invention.

FIG. 7 shows an apparatus 700 having a device 710 and an RC network 777 with a single resistor R6 and multiple capacitors C4 and C5, according to an embodiment of the invention.

Device 710 and RC network 777 may implement device 110 and RC network 111, respectively, of FIG. 1. Switches 761, 762, and 763 of FIG. 7 may implement switch circuit 160 of FIG. 1. RC network 777 of FIG. 7 and RC network 555 of FIG. 5 are different from each other at least in the number of capacitors. For example, RC network 777 of FIG. 7 includes capacitors C4 and C5, whereas RC network 555 of FIG. 5 includes only a single capacitor C2.

FIG. 7 shows capacitors C4 and C5 and resistor R6 being located outside device 710 as an example. However, any combination of capacitors C4 and C5 and resistor R6 may be located inside device 710.

Device 710 may include components and functions similar to or identical to those of device 110 of FIG. 1. Device 710 may include components and functions similar to or identical to those of device 110 of FIG. 1. For example, device 710 may include a microcontroller or other controller with a device unit such as device unit 735 to perform functions, such as executing programmed instructions, during wakeup mode and then switching from the wakeup mode to a sleep mode to save power when it finishes performing the functions.

Device 710 may include a mode switching unit 730 that responds to a $V_{SENSE}$ signal to switch device 710 between a sleep mode and a wakeup mode. The $V_{SENSE}$ signal may include a waveform similar to or identical to the waveform of the $V_{SENSE}$ signal in FIG. 3. The time that device 710 stays in a sleep mode may be proportional to the RC time constant of resistor R6 and one or more capacitors C4 and C5 of RC network 777.

The RC time constant $\tau_4$ of RC network 777 is calculated based on equation (4) below.

$$\tau_4 = RC \qquad (4)$$

In equation (4) above, R represents the value of resistor R6, and C represents the value of capacitor C4 or C5 or a parallel combination of capacitors C4 and C5, depending on whether device 710 uses one or both of capacitors C4 and C5 to select a time interval for its sleep mode. For example, if device 710 uses both of capacitors C4 and C5, then the C in equation (4) represents a value of a parallel combination capacitors C4 and C5. In another example, if device 710 uses only capacitor C4, then the C in equation (4) represents a value of only capacitor C4. Capacitors C4 and C5 may have the same or different values. The arrangement of multiple capacitors in RC network 777 allows time constant $\tau_4$ of RC network 777 to be variable so that different values for a time interval for a sleep mode of device 710 may be selected.

As shown in FIG. 7, device 710 may include a conductive contact 751 to provide a voltage Vcc from a supply node 758 to a terminal of a capacitor C4 or a terminal of a C5 or both terminals of capacitor C4 and C5, and to resistor R6 that is coupled between capacitor C4 and C5 and a supply node 759. FIG. 7 shows a ground symbol as an example for supply node 759 to indicate that supply node 759 may include ground potential or zero volts. Supply node 759, however, may include a node having a non-ground potential or non-zero volts. Supply nodes 758 and 759 may include nodes from a power source, such as a battery, of apparatus 400 to supply power to device 710. Device 710 may include conductive contacts 752, 753, and 754 coupled to RC network 777 as shown in FIG. 7. Device 710 may use conductive contact 752 to receive the $V_{SENSE}$ signal from a node 757 between resistor R6 and capacitor C4, C5, or both. Mode switching unit 730 may monitor changes in signal level of the $V_{SENSE}$ signal to switch device 710 between a sleep mode and a wakeup mode.

Mode switching unit 730 may use one or both of capacitors C4 and C5 and resistor R6 to affect the value of RC time constant $\tau_4$ of RC network 777. For example, mode switching unit 730 may use capacitor C4 and resistor R6 to affect the value of RC time constant $\tau_4$. In this example, mode switching unit 730 may use line 783 to control a switch 763 to disable capacitor C5 by decoupling it from supply node 758. In another example, mode switching unit 730 may use capacitor C5 and resistor R6 to affect the value of RC time constant $\tau_4$. In this example, mode switching unit 730 may use a switch 762 to disable capacitor C4 by decoupling it from supply node 758.

In operation, for example, device 710 is in a sleep mode, conductive contact 752 is coupled to line 771 (e.g., sense line) through a switch 761, and conductive contact 753 is coupled to supply node 758 through a switch 762. In this example, mode switching unit 730 uses capacitor C4 (capacitor C7 is disabled) and resistor R6 to affect the value of RC time constant $\tau_4$. Thus, in this example, mode switching unit 730 may use line 771 to monitor changes in signal level of the $V_{SENSE}$ signal at conductive contact 752, which may have a value of approximately Vcc at the beginning of a sleep mode. Mode switching unit 730 may switch device 710 from a sleep mode to a wake up mode when the signal level of the $V_{SENSE}$ signal reaches a voltage value such as Vy in FIG. 3 where Vy is equal to a fraction of Vcc or equal approximately to Vcc. The time interval for the $V_{SENSE}$ signal to reach a voltage value Vy depends on the discharging time of capacitor C4. Mode switching unit 730 may switch device 710 from a sleep mode to a wake up mode when the signal level of the $V_{SENSE}$ signal reaches a voltage value such as Vy within a time interval based on the time constant calculated from the value of resistor R6 and capacitor C4.

After switching to a wakeup mode, device 710 may perform functions such as executing programmed instructions. Before the end or at the end of the functions, mode switching unit 730 may charge capacitor C4 to Vcc by using line 781 to control switch 761 to decouple conductive contact 752 from line 771 and couple conductive contact 752 to supply node 758 through switch 761 and conductive contact 751. Mode switching unit 730 may also use line 782 to couple conductive contact 753 to supply node 758 through switch 762 and conductive contact 751. Capacitor C4 may charge to Vcc through switch 762. When the voltage at conductive contact 752 reaches Vcc, mode switching unit 730 may decouple conductive contact 752 from supply node 758, couple conductive contact 752 to a line 771 through switch 761, and switch device 710 from a wakeup mode to a sleep mode. Device 710 may stay in a sleep mode for a time interval and then switch to a wakeup mode after the time interval has lapsed. The time interval during which device 710 stays in a sleep mode may be similar to or identical to time interval 251 of FIG. 3. The process may repeat such that device 710 may include a sleep mode and a wakeup mode based on changes in signal level of the $V_{SENSE}$ signal.

In the example above, if capacitor C5 is also used to affect time constant $\tau_4$ of RC network 777, then mode switching unit 730 may also control switch 763 in the same way that it controls switch 762 in both a sleep mode and a wakeup mode of device 710. For example, mode switching unit 730 may couple conductive contact 754 to supply node 758 during both a sleep mode and a wakeup mode.

FIG. 7 shows apparatus 700 without a circuit component, such as circuit component 533 of FIG. 5, coupled between conductive contact 752 and node 757. Alternatively, apparatus 700 may include a circuit component, such as circuit component 533 of FIG. 5, coupled between conductive contact 752 and node 757 to reduce or eliminate a relatively high amount of discharge current that may occur when one or both of capacitors C4 and C5 discharge to avoid operation disturbance to device 710 or improve its performance.

Example Apparatus Embodiment With Fifth Device-RC Network Arrangement

Figure 8:
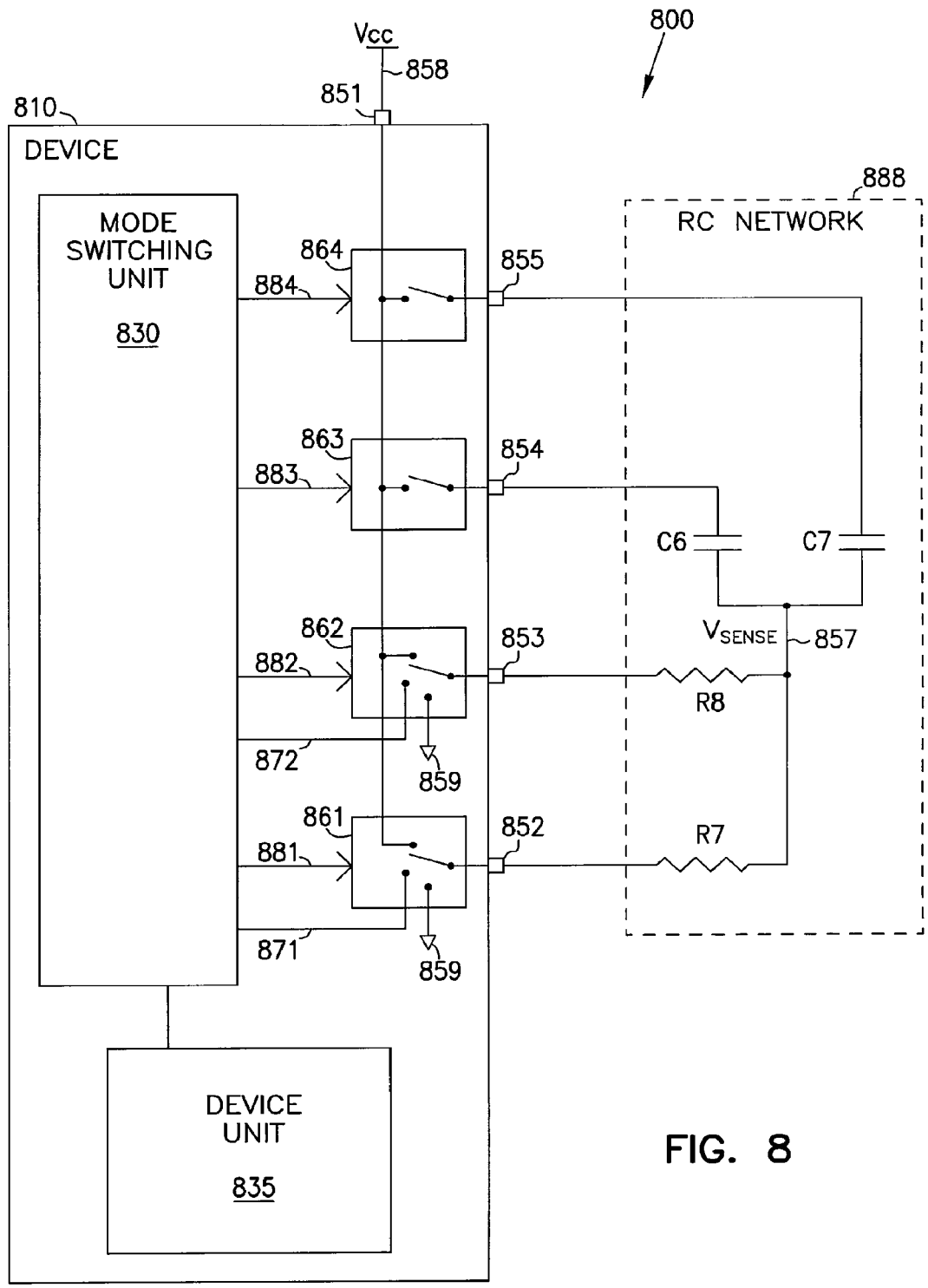
FIG. 8 shows an apparatus having a device and an RC network with multiple resistors and multiple capacitors, according to an embodiment of the invention.

FIG. 8 shows an apparatus 800 having a device 810 and an RC network 888 with multiple resistors R7 and R8 and multiple capacitors C6 and C7, according to an embodiment of the invention. Device 810 and RC network 888 may implement device 110 and RC network 111, respectively, of FIG. 1. Switches 861, 862, and 863 of FIG. 8 may implement switch circuit 160 of FIG. 1. RC network 888 of FIG. 8, RC network 666 of FIG. 6, and RC network 777 of FIG. 7 are different from among each other at least in the number of capacitors and resistors such that 888 of FIG. 8 may include a combination of and RC networks 666 and of FIG. 6 and RC networks 777 of FIG. 7.

FIG. 8 shows capacitors C6 and C7 and resistor R7 being located outside device 810 as an example. However, any combination of capacitors C6 and C7 and resistors R7 and R8 may be located inside device 810.

Device 810 may include components and functions similar to or identical to those of device 110 of FIG. 1. Device 810 may include components and functions similar to or identical to those of device 110 of FIG. 1. For example, device 810 may include a microcontroller or other controller with a device unit such as device unit 835 to perform functions, such as executing programmed instructions, during a wakeup mode and then switching from the wakeup mode to a sleep mode to save power when it finishes performing the functions.

In FIG. 8, device 810 may include a mode switching unit 830 that responds to a $V_{SENSE}$ signal to switch device 810 between a sleep mode and a wakeup mode. The $V_{SENSE}$ signal may include a waveform similar to or identical to the waveform of the $V_{SENSE}$ signal in FIG. 3. The time that device 810 stays in a sleep mode may be proportional to the RC time constant of either resistor R7 or R8 and one or both of capacitors C6 and C7 of RC network 888.

The RC time constant $\tau_5$ of RC network 888 is calculated based on equation (5) below.

$$\tau_5 = RC \quad (5)$$

In equation (5) above, R represents the value of either resistor R7 or R8, and C represents the value of capacitor C6 or C7 or a parallel combination of capacitors C6 and C7, depending on whether device 810 uses one or both of capacitors C6 and C7 to select a time interval for its sleep mode. For example, if device 810 uses both of capacitors C6 and C7, then the C in equation (5) represents a value of a parallel combination of capacitors C6 and C7. In another example, if device 810 uses only capacitor C6, then the C in equation (5) represents a value of only capacitor C6. Capacitors C6 and C7 may have the same or different values. Resistors R7 and R8 may have the same or different values. The arrangement resistors and multiple capacitors in RC network 888 allows time constant $\tau_5$ of RC network 888 to be variable so that different values for a time interval for a sleep mode of device 810 may be selected.

As shown in FIG. 8, device 810 may include a conductive contact 851 to provide a voltage Vcc from a supply node 858 to capacitor C6 or C7, or both and to either resistor R7 or R8. Mode switching unit 830 may couple either resistor R7 or R8 to a supply node 859 during a sleep mode, as described in more detail below. FIG. 8 shows a ground symbol as an example for supply node 859 to indicate that supply node 859 may include ground potential or zero volts. Supply node 859, however, may include a node having a non-ground potential or non-zero volts. Supply nodes 858 and 859 may include nodes from a power source, such as a battery, of apparatus 400 to supply power to device 810. Device 810 may include conductive contacts 852, 853, 854, and 855 coupled to RC network 888 as shown in FIG. 8. Device 810 may use either conductive contact 852 or 853 to receive the $V_{SENSE}$ signal from a node 857. Mode switching unit 830 may monitor changes in signal level of the $V_{SENSE}$ signal to switch device 810 between a sleep mode and a wakeup mode.

Mode switching unit 830 may use one or both of capacitors C6 and C7 and only one of resistors R7 and R8 (e.g., R7) to affect the value of RC time constant $\tau_5$ of RC network 888. Mode switching unit 830 may use the other resistor (e.g., R8) as part of a conductive path that is coupled to one of lines (e.g., sense lines) 871 and 872 to allow mode switching unit 830 to monitor changes in signal level of the $V_{SENSE}$ signal. For example, mode switching unit 830 may use capacitor C6 and only resistor R7 to affect the value of RC time constant $\tau_5$. In this example, mode switching unit 830 may use a switch 864 to disable capacitor C7 by decoupling it from supply node 858. Also in this example, mode switching unit 830 may use resistor R8 as part of a conductive path that is coupled to conductive contact 853 to allow mode switching unit 830 to monitor changes in signal level of the $V_{SENSE}$ signal received at conductive contact 853 through resistor R8.

In operation, for example, device 810 is in a sleep mode and conductive contact 852 is coupled to supply node 859 through a switch 861, conductive contact 853 is coupled to line 872 through a switch 862, and conductive contact 854 is coupled to supply node 858 through a switch 863. Mode switching unit 830 may use lines 881, 883, and 884 to control switches 861, 863, and 864, respectively. In this example, mode switching unit 830 uses capacitor C6 (capacitor C7 is disabled) and resistor R7 to affect the value of RC time constant $\tau_5$ and use resistor R8 as part of a conductive path that couples node 857 to line 872. Thus, in this example, mode switching unit 830 may monitor changes in signal level of the $V_{SENSE}$ signal through a path that includes resistor R8, conductive contact 853, switch 862, and line 872. Mode switching unit 830 may switch device 810 from a sleep mode to a wake up mode when the signal level of the $V_{SENSE}$ signal reaches a voltage value such as Vy in FIG. 3 where Vy is equal to a fraction of Vcc or equal approximately to Vcc. The time interval for the $V_{SENSE}$ signal to reach a voltage value Vy is proportional to the discharging time of capacitor C6 in this example.

After switching to a wakeup mode, device 810 may perform functions such as executing programmed instructions. Before the end or at the end of the functions, mode switching unit 830 may charge capacitor C6 to Vcc by using line 882 to control switch 862 to decouple conductive contact 853 from line 872 and couple conductive contact 853 to supply node 858 through switch 862 and conductive contact 851. Capacitor C6 may charge to Vcc through switch 862. When the voltage at conductive contact 853 reaches Vcc, mode switching unit 830 may decouple conductive contact 853 from supply node 858, couple conductive contact 853 to line 872, and switch device 810 from a wakeup mode to a sleep mode. Device 810 may stay in a sleep mode for a time interval and then switch to a wakeup mode after the time interval has lapsed. The time interval during which device 810 stays in a sleep mode may be similar to or identical to time interval 251 of FIG. 3. The process may repeat such that device 810 may include a sleep mode and a wakeup mode based on changes signal level of the $V_{SENSE}$ signal.

In the example above, if capacitor C7 is also used to affect time constant $\tau_5$ of RC network 888, then mode switching unit 830 may also control switch 864 in the same way that it controls switch 863 in both a sleep mode and a wakeup mode of device 810. Further, the example above uses resistor R7 to affect time constant $\tau_5$ of RC network 888 and uses resistor R8 as a part of the conductive path that is coupled to line 872 to allow mode switching unit 830 to monitor changes in signal level of the $V_{SENSE}$ signal. However, if resistor R8 (instead of R7) is used to affect time constant $\tau_5$ of RC network 888, then mode switching unit 830 may monitor changes in signal level of the $V_{SENSE}$ signal received at conductive contact 852 through resistor R7.

Example Method Embodiment

Figure 9:
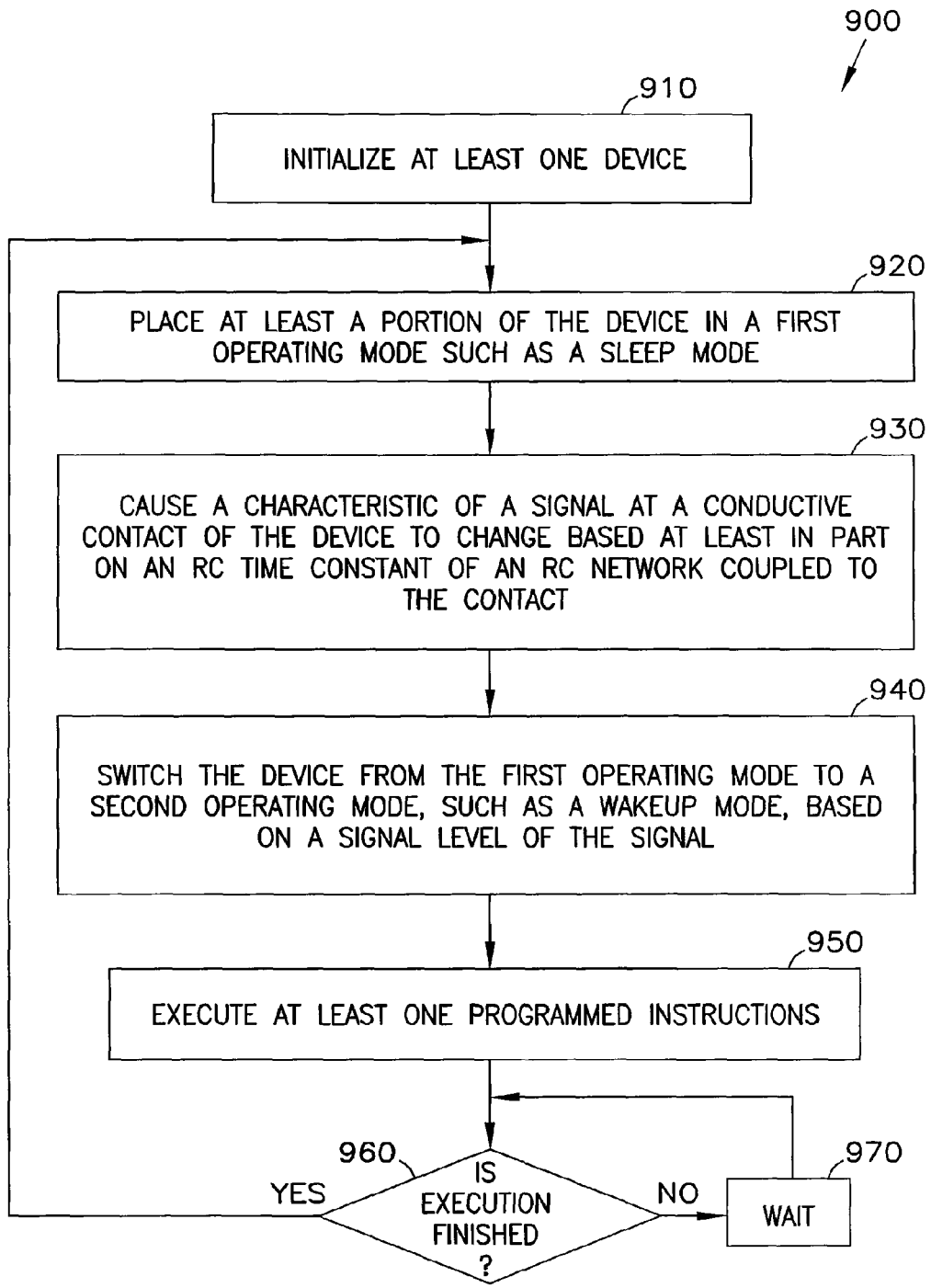
FIG. 9 is a flowchart showing a method of operating a device according to an embodiment of the invention.

FIG. 9 is a flowchart showing a method 900 of operating a device according to an embodiment of the invention. Method 900 may be used in an apparatus that is similar to or identical to apparatus 100, 400, 500, 600, 700, and 800 described above with reference to FIG. 1 through FIG. 8. Thus, the components of apparatus and devices used in method 900 may include the components of apparatus 100, 400, 500, 600, 700, and 800 described above with reference to FIG. 1 through FIG. 8. Therefore, the device used in method 900 may include a microcontroller.

In FIG. 9, activity 910 of method 900 may include initializing at least one device. For example, method 900 may be used in apparatus 100 in which method 900 may initialize at least one of devices 110 and 120 and/or other components of apparatus 100. As described above with reference to FIG. 1, device 110 may include a microcontroller. Thus, in FIG. 9, activity 910 may include initializing a microcontroller. Activity 910 may perform the initialization during power-on at which power may be applied to the apparatus or the device, for example, at time a power switch of the apparatus is turned on. Activity 910 may also perform the initialization during other times.

Activity 920 may include placing at least a portion of the device in a first operating mode. For example, the device may include a microcontroller and activity 920 may place only a portion of the microcontroller or the entire microcontroller in a sleep mode.

Activity 930 may include causing a characteristic a signal at a conductive contact of the device (e.g., a microcontroller) to change based at least in part on a resistor-capacitor (RC) time constant of an RC network coupled to the conductive contact.

Activity 940 may include switching the device from the first operating mode to a second operating mode based on a signal level of the signal. The second operating mode may include a wakeup mode. The sleep and wakeup modes in method 900 may be similar to or identical to those described above with reference to FIG. 1 through FIG. 8.

Activity 950 may include executing at least one programmed instruction when the device is in the second operating mode (e.g., a wakeup mode).

Activity 960 may include determining whether the execution of the programmed instructions in activity 950 is finished. If activity 960 determines that the execution is not finished, then method 900 may wait until the execution is finished, as indicated by activity 970. If activity 960 determines that the execution is finished, then method 900 may go back to activity 920. Method 900 may repeat one or more of the activities illustrated in FIG. 9 in a periodical or non-periodical fashion.

Method 900 may include other activities similar to or identical to the activities described above with reference to FIG. 1 and FIG. 8. Various embodiments may have more or fewer activities than those illustrated in FIG. 9.

Example System Embodiment

Figure 10:
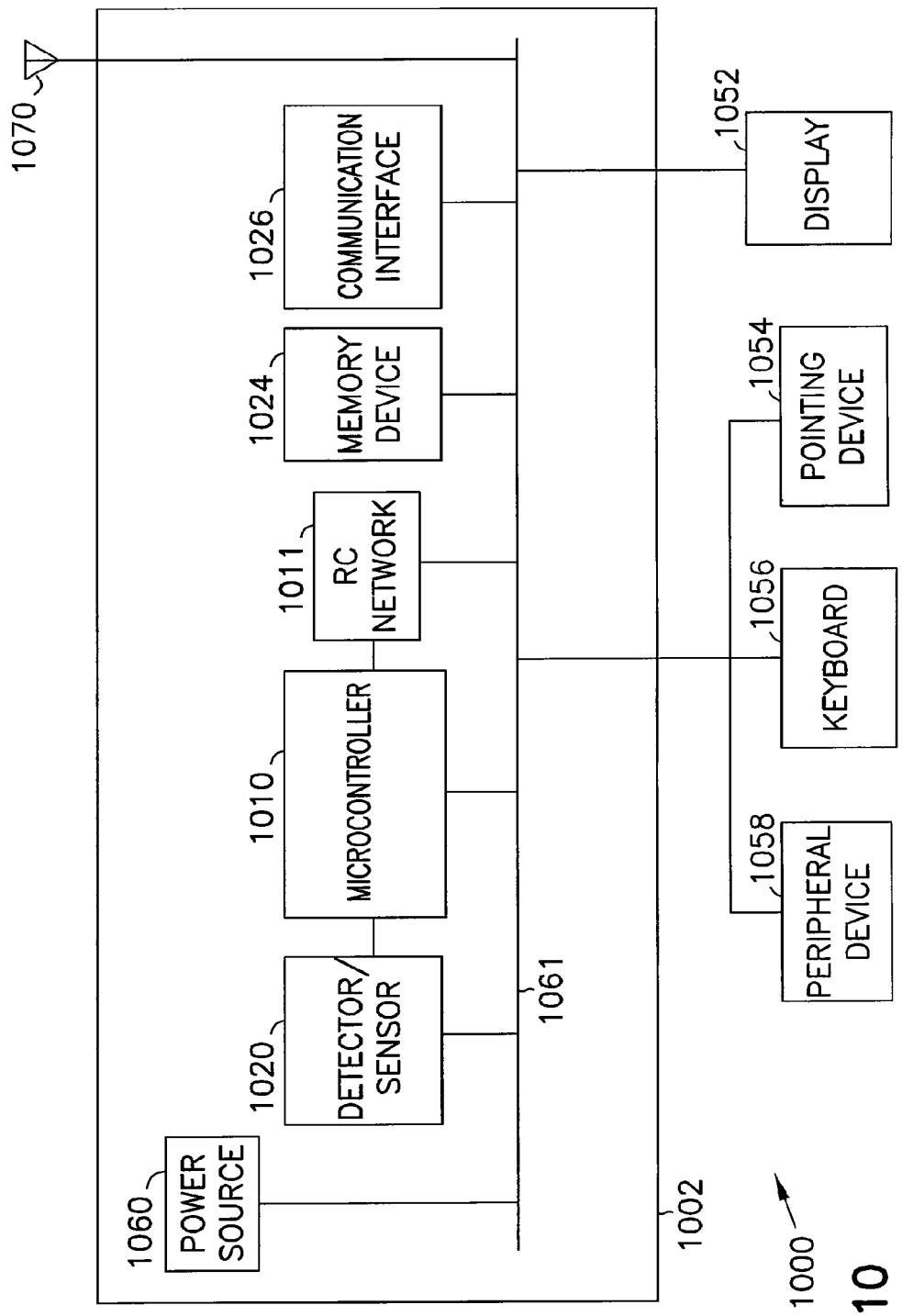
FIG. 10 shows a system according to an embodiment of the invention.

FIG. 10 shows a system 1000 according to various embodiments of the invention. System 1000 may include a microcontroller 1010, a detector/sensor 1020, and an RC network 1011. These components may include embodiments of the devices and RC networks described above with reference to FIG. 1 through FIG. 8. System 1000 of FIG. 10 may also include a memory device 1024, a communication interface 1030, a display 1052, a pointing device 1054, a keyboard 1056, a peripheral device 1058, and a power source 1060, which may include a battery. System 1000 may also include a bus 1061 to transfer information among the components of system 1000 and provide power to at least some of these components. System 1000 may also include an antenna 1070 to wirelessly transmit and receive information to and from system 1000. System 1000 may further include a circuit board 1002 where some of the components of system may be attached.

Memory device 1024 may include a volatile memory device, a non-volatile memory device, or a combination of both. For example, memory device 1024 may include a DRAM device, an SRAM device, a flash memory device, phase change memory device, or a combination of these memory devices.

Detector/sensor device 1020 may include one of or a combination of motion detector, temperature sensor, and other type of detector/sensor device. Display 1052 may include an analog display or a digital display to display information such as text or images.

RC network 1011 may include one or more of the various devices RC network described herein, such as RC networks 111, 444, 555, 666, 777, and 888 described above with reference to FIG. 1 through FIG. 8.

Microcontroller 1010 may include one or more of the various devices described herein, such as device 110, 410, 510, 610, 710, or 810 described above with reference to FIG. 1 through FIG. 8. Microcontroller 1020 and memory device 1024 may be included in the same IC package. In system 1000, microcontroller 1020 may execute one or more programmed instructions to process information. The information may include information provided by one or more components of system 1000 such as memory device 1024 and detector/sensor 1026.

CONCLUSION

The illustrations of apparatus (e.g., apparatus 100, 400, 500, 600, 700, and 800 and devices 110, 410, 510, 610, 710, and 810) and systems (e.g., system 1000) are intended to provide a general understanding of the structure of various embodiments and are not intended to provide a complete description of all the components and features of apparatus and systems that might make use of the structures described herein.

Any of the components described above can be implemented in a number of ways, including simulation via software. Thus, apparatus (e.g., apparatus 100, 400, 500, 600, 700, and 800 and devices 110, 410, 510, 610, 710, and 810) and systems (e.g., system 1000) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., apparatus 100, 400, 500, 600, 700, and 800 and devices 110, 410, 510, 610, 710, or 810) and systems (e.g., system 1000), and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus and systems of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitors, blood pressure monitors, etc.), set top boxes, motion detectors, temperature sensors, and others.

One or more embodiments described herein include apparatus, systems, and methods having a conductive contact configured to couple to a resistor-capacitor (RC) network, a device unit coupled to the conductive contact, and a mode switching unit to change a characteristic of a signal at the conductive contact based at least in part on an RC time constant of the RC network. The mode switching unit may switch the device unit between a first operating mode and a second operating mode based on a signal level of the signal. Other embodiments including additional apparatus, systems, and methods are described above with reference to FIG. 1 through FIG. 10.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of other embodiments. Many other embodiments will be apparent to those of skill in the art upon reading and understanding the above description.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the claims.

The invention claimed is:

1. An apparatus comprising:
   a charge storage device coupled to a resistive network;
   a device unit; and
   a mode switching unit coupled to the charge storage device and resistive network using at least a first conductive contact,
   wherein the mode switching unit is configured to detect a characteristic of a signal at the first conductive contact and switch the device unit between a first operating mode and a second operating mode based on a signal level of the signal, and wherein the device unit uses less power when the device unit is in the first operating mode than when the device unit is in the second operating mode.

2. The apparatus of claim 1, wherein the charge storage device is a capacitor.

3. The apparatus of claim 1, wherein the mode switching unit is configured to switch the device unit in to the second operating mode when the signal level of the signal reaches a first threshold, and switch the device unit in to the first operating mode when the signal level of the signal reaches a second threshold,
   wherein each of the first threshold and the second threshold is a predetermined percentage of a supply voltage, and
   wherein the predetermined percentage of the first threshold is distinct from the predetermined percentage of the second threshold.

4. The apparatus of claim 3, wherein the mode switching unit is configured to couple the first conductive contact to a supply node through a first switch when the device unit is in the second operating mode, and decouple the first conductive contact from the supply node when the device unit is in the first operating mode.

5. The apparatus of claim 3, wherein a time taken by the signal level of the signal to reach the first threshold is associated with a discharging time of the charge storage device that is based on whether each of a first resistor and a second resistor included in the resistive network are enabled or disabled, and
   wherein based on a determination that the first resistor is enabled, the mode switching unit is configured to couple a third conductive contact connecting the first resistor to an additional supply node through a second switch when the device unit is in the second operating mode.

6. The apparatus of claim 5, wherein based on a determination that the second resistor is enabled, the mode switching unit is configured to couple a fourth conductive contact connecting the second resistor to the additional supply node through a third switch when the device unit is in the second operating mode.

7. The apparatus of claim 6, further comprising:
   a third resistor included in the resistive network and coupled to the charge storage device,
   wherein based on a determination that the third resistor is enabled, the mode switching unit is configured to couple a fifth conductive contact connecting the third resistor to the additional supply node through a fourth switch when the device unit is in the second operating mode.

8. An apparatus comprising:
   a first charge storage device and a second charge storage device that are coupled to a resistive network;
   a device unit; and
   a mode switching unit coupled to each of the first and second charge storage devices and the resistive network using at least a first conductive contact,
   wherein the mode switching unit is configured to detect a characteristic of a signal at the first conductive contact and switch the device unit between a first operating mode and a second operating mode based on a signal level of the signal, and wherein the device unit uses less power when the device unit is in the first operating mode than when the device unit is in the second operating mode.

9. The apparatus of claim 8, wherein at least one of the first and second charge storage devices is a capacitor.

10. The apparatus of claim 8, wherein the resistive network includes at least one resistor having a terminal that is coupled to a ground potential, and wherein the resistive network includes at least one additional resistor that is configured to couple the first conductive contact to each of the first and second charge storage devices, and the at least one resistor.

11. The apparatus of claim 8, wherein the mode switching unit is configured to switch the device unit into the second operating mode when the signal level of the signal reaches a first threshold, and switch the device unit in to the first operating mode when the signal level of the signal reaches a second threshold, wherein each of the first threshold and the second threshold is a predetermined percentage of a supply voltage, and wherein the predetermined percentage of the first threshold is distinct from the predetermined percentage of the second threshold.

12. The apparatus of claim 11, wherein a time taken by the signal level of the signal to reach the first threshold is associated with a discharging time of at least one of the first charge storage device and the second charge storage device.

13. The apparatus of claim 11, wherein the mode switching unit is configured to couple the first conductive contact to a supply node through a first switch when the device unit is in the second operating mode, and to decouple the first conductive contact from the supply node when the device unit is in the first operating mode, and wherein the mode switching unit is configured to couple a second conductive contact connecting the first charge storage device to the supply node through a second switch when the device unit is in the second operating mode.

14. The apparatus of claim 13, wherein the mode switching unit is configured to couple a third conductive contact connecting the second charge storage device to the supply node through a third switch when the device unit is in the second operating mode.

15. An apparatus comprising:

a first charge storage device and a second charge storage device that are coupled to a resistive network;

a device unit; and a mode switching unit that is coupled to each of the first and second charge storage devices using at least one of a first conductive contact and a second conductive contact, wherein the mode switching unit is configured to detect a characteristic of a signal at one of the first and second conductive contacts and switch the device unit between a first operating mode and a second operating mode based on a signal level of the signal, and wherein the device unit uses less power when the device unit is in the first operating mode than when the device unit is in the second operating mode.

16. The apparatus of claim 15, wherein at least one of the first and second charge storage devices is a capacitor.

17. The apparatus of claim 15, wherein the mode switching unit is configured to switch the device unit into the second operating mode when the signal level of the signal reaches a first threshold, and switch the device unit into the first operating mode when the signal level of the signal reaches a second threshold, wherein each of the first threshold and the second threshold is a predetermined percentage of a supply voltage, and wherein the predetermined percentage of the first threshold is distinct from the predetermined percentage of the second threshold.

18. The apparatus of claim 17, wherein based on a determination that the first charge storage device is enabled, the mode switching unit is configured to couple a third conductive contact connecting the first charge storage device to a first supply node through a first switch when the device unit is in the second operating mode.

19. The apparatus of claim 18, wherein based on a determination that the second charge storage device is enabled, the mode switching unit is configured to couple a fourth conductive contact connecting the second charge storage device to the first supply node through a second switch when the device unit is in the second operating mode.

20. The apparatus of claim 18, wherein a time taken by the signal level of the signal to reach the first threshold is associated with a discharging time of at least one of the first and the second charge storage devices, which is based on whether at least one resistor included in the resistive network is enabled or disabled, and wherein based on a determination that the at least one resistor is enabled, the mode switching unit is configured to couple the first conductive contact connecting the at least one resistor to the first supply node through a third switch when the device unit is in the second operating mode, and couple the first conductive contact to a second supply node when the device unit is in the first operating mode.

21. The apparatus of claim 20, wherein the second supply node is at a ground potential.

22. The apparatus of claim 20, wherein the resistive network includes an additional resistor that is coupled to the mode switching unit using the second conductive contact, and wherein based on a determination that the additional resistor is enabled, the mode switching unit is configured to couple the second conductive contact to the first supply node using a fourth switch when the device unit is in the second operating mode, and couple the second conductive contact to the second supply node when the device unit is in the first operating mode.

* * * * *